US007363599B1

(12) United States Patent
Vogenthaler

(10) Patent No.: US 7,363,599 B1
(45) Date of Patent: Apr. 22, 2008

(54) METHOD AND SYSTEM FOR MATCHING A HIERARCHICAL IDENTIFIER

(75) Inventor: Alexander R. Vogenthaler, New York, NY (US)

(73) Assignee: Xilinx, Inc., San Jose, CA (US)

( * ) Notice: Subject to any disclaimer, the term of this patent is extended or adjusted under 35 U.S.C. 154(b) by 317 days.

(21) Appl. No.: 11/243,732

(22) Filed: Oct. 4, 2005

(51) Int. Cl.
G06F 17/50 (2006.01)
(52) U.S. Cl. .................................. 716/2; 716/4; 716/18
(58) Field of Classification Search ...................... None
See application file for complete search history.

(56) References Cited

U.S. PATENT DOCUMENTS

| | | | |
|---|---|---|---|
| 4,758,953 A * | 7/1988 | Morita et al. ................. | 716/1 |
| 5,095,441 A * | 3/1992 | Hopper et al. ................ | 716/18 |
| 5,249,133 A * | 9/1993 | Batra ........................... | 716/5 |
| 5,452,239 A | 9/1995 | Dai et al. | |
| 5,553,272 A | 9/1996 | Ranganathan et al. | |
| 5,870,588 A | 2/1999 | Rompaey et al. | |
| 5,896,301 A | 4/1999 | Barrientos | |
| 5,898,595 A | 4/1999 | Bair et al. | |
| 5,910,899 A | 6/1999 | Barrientos | |
| 6,011,911 A | 1/2000 | Ho et al. | |
| 6,023,567 A | 2/2000 | Osier et al. | |
| 6,078,736 A | 6/2000 | Guccione | |
| 6,131,080 A | 10/2000 | Raimi et al. | |
| 6,135,647 A | 10/2000 | Balakrishnan et al. | |
| 6,154,719 A | 11/2000 | Saitoh et al. | |
| 6,230,299 B1 | 5/2001 | McSherry et al. | |
| 6,272,671 B1 | 8/2001 | Fakhry | |
| 6,530,071 B1 | 3/2003 | Guccione et al. | |
| 6,530,072 B1 | 3/2003 | Hagerman et al. | |
| 6,546,532 B1 | 4/2003 | Kerzman et al. | |
| 6,557,156 B1 | 4/2003 | Guccione | |
| 6,622,291 B1 | 9/2003 | Ginetti | |
| 6,678,646 B1 | 1/2004 | McConnell et al. | |

(Continued)

OTHER PUBLICATIONS

Navarro, Gonzalo, "Pattern Matching", pp. 1-24, available from University of Chile, Department of Computer Science, Av. Diagonal Paraguay 265 office 703—Santiago—Chile, Phone (562) 978-2583, http:/ /www.ciw.cl/publicaciones/jstsat04.pdf.

(Continued)

Primary Examiner—Leigh M. Garbowski
(74) Attorney, Agent, or Firm—Leroy D. Maunu; Lois D. Cartier

(57) ABSTRACT

A first hierarchical identifier is efficiently matched with a particular hierarchical identifier from a set of second hierarchical identifiers of a design in a high level modeling system. The matching tolerates name changes and additional design details in the hierarchical identifiers. A first sub-identifier at each level of the first hierarchical identifier is pattern matched with each second sub-identifier at a corresponding level of at least one second hierarchical identifier in a respective first subset of the second hierarchical identifiers. The pattern matching may include determining an edit distance between the first and second sub-identifiers. For each of the levels, a respective second subset of the respective first subset is determined in response to the pattern matching. The particular hierarchical identifier is selected from an intersection of all of the second subsets. The particular hierarchical identifier of the design is displayed on a user interface of the high-level modeling system.

20 Claims, 5 Drawing Sheets

U.S. PATENT DOCUMENTS

| | | | |
|---|---|---|---|
| 6,725,441 | B1 | 4/2004 | Keller et al. |
| 6,756,922 | B2 | 6/2004 | Ossia |
| 6,865,726 | B1 | 3/2005 | Igusa et al. |
| 6,868,017 | B2 | 3/2005 | Ikeda |
| 6,868,532 | B2 | 3/2005 | Nadeau-Dostie et al. |
| 6,922,665 | B1 | 7/2005 | Guccione et al. |
| 6,993,733 | B2 | 1/2006 | Murphy |
| 7,003,751 | B1 | 2/2006 | Stroomer et al. |
| 7,006,960 | B2 | 2/2006 | Schaumont et al. |
| 7,024,654 | B2 | 4/2006 | Bersch et al. |
| 7,073,152 | B2 * | 7/2006 | Keller et al. ............ 716/12 |
| 7,139,955 | B2 | 11/2006 | Rohrbaugh et al. |
| 7,143,367 | B2 | 11/2006 | Eng |
| 7,146,583 | B1 | 12/2006 | Sun et al. |
| 7,194,714 | B2 | 3/2007 | Kartschoke et al. |
| 7,203,632 | B2 | 4/2007 | Milne et al. |
| 7,216,321 | B2 * | 5/2007 | Murphy et al. ............ 716/7 |
| 2001/0007139 | A1 | 7/2001 | Murray |
| 2002/0049958 | A1 | 4/2002 | Shimazawa |
| 2002/0059054 | A1 | 5/2002 | Bade et al. |
| 2003/0084416 | A1 | 5/2003 | Dai et al. |
| 2003/0216901 | A1 | 11/2003 | Schaumont et al. |
| 2004/0015613 | A1 | 1/2004 | Ikeda |
| 2004/0141354 | A1 | 7/2004 | Carnahan |
| 2005/0188339 | A1 * | 8/2005 | Anderson ............ 716/11 |
| 2005/0210383 | A1 | 9/2005 | Cucerzan et al. |
| 2005/0268258 | A1 | 12/2005 | Decker |
| 2005/0268269 | A1 | 12/2005 | Colley |
| 2006/0059134 | A1 | 3/2006 | Palmon et al. |
| 2006/0090146 | A1 | 4/2006 | LeBritton et al. |
| 2006/0136193 | A1 | 6/2006 | Lux-Pogodalla et al. |
| 2006/0200788 | A1 | 9/2006 | Nation et al. |

OTHER PUBLICATIONS

J. Eker et al.; "CAL Language Report—Specification of the CAL actor Language"; Version 1.0, document edition 1; ERL Technical Memo UCB/ERL, M03/48; University of California at Berkeley; Dec. 1, 2003; pp. 1-112.

Massimo Ravasi et al.; "High-Level Algorithmic Complexity Evaluation for System Design"; Journal of Systems Architecture; Feb. 2003; Copyright 2003 Elsevier Science B.V.; available at www.ComputerScienceWeb.com; pp. 403-427.

Xilinx, Inc.; "Two Flows for Partial Reconfiguration: Module Based or Difference Based"; XAPP290 (v1.2); Sep. 9, 2004; available from www.xilinx.com; pp. 1-28.

Xilinx, Inc.; U.S. Appl. No. 11/373,745 by Janneck et al. filed Mar. 10, 2006.

Xilinx, Inc.; U.S. Appl. No. 11/373,744 by Janneck et al. filed Mar. 10, 2006.

Xilinx, Inc.; U.S. Appl. No. 11/243,679 by Janneck et al. filed Mar. 10, 2005.

Xilinx, Inc.; U.S. Appl. No. 11/373,709 by Schumacher et al. filed Oct. 4, 2005 by Xilinx, Inc.

Xilinx, Inc.; U.S. Appl. No. 11/083,667 by Milne et al. filed Mar. 18, 2005 by Xilinx, Inc.

Michael Gilleland, "Levenshtein Distance In Three Flavors", , available from http://www.merriampark.com/ld.htm; pp. 1-12.

Hsu, Chia-Jui et al.; "DIF: An Interchange Format For Dataflow-based Design Tools"; International Workshop on Systems, Architectures, Modeling and Simulation; Jul. 2004; available from Department of Electrical and Computer Engineering and Institute for Advanced Computer Studies, University of Maryland, College Park, 20742; pp. 1-10.

Lee, Edward A. et al.; "Dataflow Process Networks"; May 1995; IEEE, vol. 83, No. 5; available from IEEE, 3 Park Avenue, 17th Floor, New York, NY 10016-5997; pp. 773-799.

Bhattacharyya Shuvra Shikhar; "Compiling Dataflow Programs For Digital Signal Processing"; Jul. 1994; available from Department of Electrical Engineering and Computer Sciences, University of California at Berkeley, Berkeley, CA 94720; pp. 1-250.

Tanaka et al.; "High Speed String Edit Methods Using Hierarchical Files and Hashing Technique"; Nov. 14-17, 1988 Pattern Recoignition; 9th International Conference; vol. 1; Copyright 1988 IEEE; pp. 334-336.

* cited by examiner

US 7,363,599 B1

METHOD AND SYSTEM FOR MATCHING A HIERARCHICAL IDENTIFIER

FIELD OF THE INVENTION

The present invention generally relates to electronic design tools.

BACKGROUND

A high-level modeling system (HLMS) allows a user to assemble, simulate, and debug an electronic circuit design. Some HLMS', such as the System Generator HLMS from Xilinx, also allow the design to be translated into a hardware description language (HDL).

An electronic circuit design in an HLMS is generally assembled with design blocks. Each block performs a desired function in the design, and instances of the blocks are connected to accomplish the overall function of the design. For user convenience in assembling and manipulating the design, the block instances may be hierarchically arranged or nested such that a block instance may include one or more sub-block instances.

Additional tools are used in transforming the high-level design into a low-level form that is realizable in hardware. These tools provide functions of technology mapping, component placement, and signal routing. In many instances, these tools change the names of the components or elements in the design, which makes analysis challenging if the user is used to working with high-level designs.

A low-level design may be analyzed to determine whether certain objectives, such as timing constraints, have been achieved. However, the user of an HLMS may be unable to easily inspect and understand the information produced by the low-level analyzers. The difficulties arise because a low-level analyzer expresses the output information using the names it received as input or as may have been modified by the analyzer. Since the names presented by the low-level analyzer may be different from the names in the high-level modeling system, it may be difficult to make use of the analyzer output for a designer accustomed to working at the high-level provided by the HLMS.

The present invention may address one or more of the above issues.

SUMMARY OF THE INVENTION

Various embodiments of the invention provide a method for matching a hierarchical identifier with a block instance of a design in a high-level modeling system. A tree is generated that represents a hierarchy of the block instances of the design in the high-level modeling system. The tree includes a respective node for each block instance of the design, and the respective node includes a first name of the block instance. The first name of each node in a first subset of each level of the hierarchy is pattern matched with a second name at a corresponding level of the hierarchical identifier. A second subset of the first subset of each level of the hierarchy is selected as a function of the pattern matching for the level. For each successive level of the hierarchy of the tree other than a final level, a set of children of the second subset of the level of the hierarchy includes another first subset of a successive level of the hierarchy. A node is selected from another second subset of the final-level of the hierarchy, block instance is determined for the node, and a symbol representative of the block instance is displayed.

Various other embodiments of the invention provide a method for matching a first hierarchical identifier with a particular hierarchical identifier from a set of second hierarchical identifiers of a design in a high level modeling system. A first sub-identifier at each level of the first hierarchical identifier is pattern matched with each second sub-identifier at a corresponding level of at least one second hierarchical identifier in a respective first subset of the second hierarchical identifiers. For each of the levels, a respective second subset of the respective first subset is determined in response to the pattern matching. The particular hierarchical identifier is selected from an intersection of all of the second subsets. The particular hierarchical identifier of the design is displayed on a user interface of the high-level modeling system.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION

Figure 1:
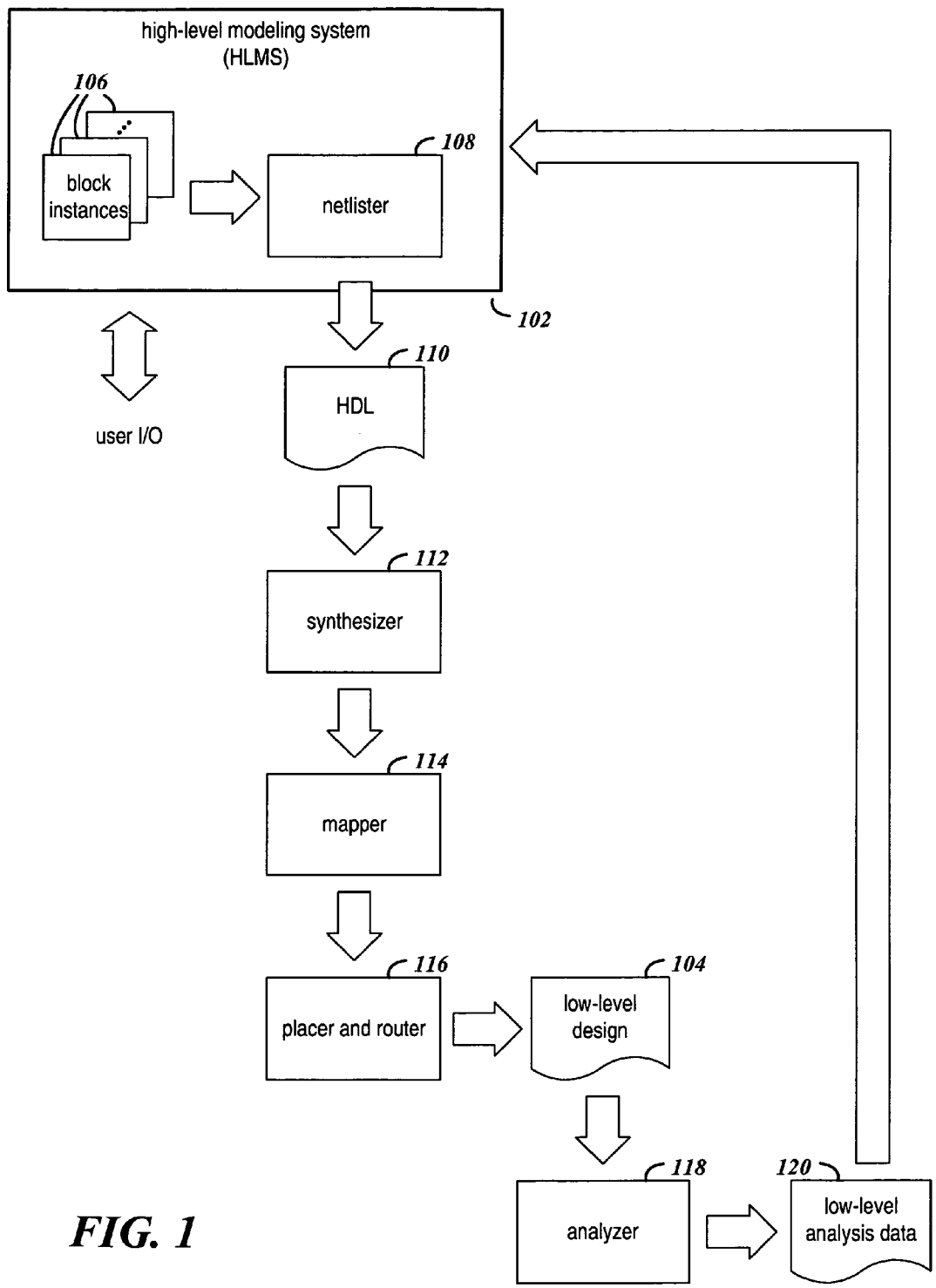
FIG. 1 is a flow diagram that shows the transformation of a high-level design in a high level modeling system (HLMS) to a low-level design in accordance with various embodiments of the invention.

FIG. 1 is a flow diagram that shows the transformation of a high-level design in a high level modeling system (HLMS) 102 to a low-level design 104. The design information for the high-level design of an electronic circuit design may be created in the HLMS 102 by a user selecting and connecting various design block instances 106.

A netlister 108 may transform the high-level design of block instances 106 into a hardware description language 110 (HDL) representation of the high-level design. The HDL 110 may be processed by a sequence of tools including a synthesizer 112, a mapper 114, and a placer and router 116 to produce the low level design 104. Typically, the low level design 104 extends the hierarchy present in the high-level design by mapping each block instance 106 into a collection of interconnected primitives, such as AND gates, OR gates, and look-up tables.

An analyzer 118 may determine certain characteristics of the low-level design 104 and report these characteristics as the low-level analysis data 120. An example analyzer 118 is a static timing analyzer that generates low-level analysis data 120, including, for example, the longest timing paths of the low level design 104. Typically, the timing paths generated by a static timing analyzer are sorted by the length of the propagation delay for each path with the timing path having the longest propagation delay appearing first in the low level analysis data 120. For example, the longest timing paths may be reported in low level analysis data 120 as a sorted listing of any timing paths having a propagation delay greater than a targeted period of a clock signal of the electronic circuit design.

A sorted listing of longest timing paths that includes timing paths with propagation delays greater than a targeted clock period reports the timing paths that may prevent achievement of the targeted clock period. The timing paths presented first in this listing of longest timing paths represent the timing paths which most seriously prevent operation at the targeted clock period. Judicious rearrangement of the high level block instances 106 may be required to fix the timing paths with lengths that exceed the targeted clock period. In addition to re-arranging the block instances in a design, timing may also be improved by re-configuring the internals of individual blocks. If, for example, the critical timing path goes through a multiplier block, it may be possible to improve timing by configuring the multiplier to be implemented with special hardware present in the device, such as an embedded multiplier, rather than synthesizing the multiplier in the fabric of the device.

Each timing path in a listing of longest timing paths of low-level analysis data 120 may be specified by the sequence of primitives of low-level design 104 along the timing path. Each primitive on a timing path may be specified by a hierarchical identifier or name for the primitive. The hierarchical identifier may include the instance names of the ancestors of the primitive in the design hierarchy and the name of the primitive separated by slash characters, for example.

Each timing path may be further specified by including the input port and the output port of each block and primitive along the timing path. For example, each timing path may be specified by the hierarchical name for each input port of a block or primitive along the timing path and each output port of a block or primitive along the timing path. A primitive's input port may be specified by the block names of the primitive and the primitive's ancestors in the design hierarchy and the name of the input port separated by slash characters. A primitive's output port and a block's input and output ports may be correspondingly specified.

Fixing timing paths in the HLMS 102 with a propagation delay that exceeds the targeted clock period may be time consuming because the matching of the hierarchical identifiers of the primitives of the low-level design 104 to the block instances 106 may be difficult.

The matching of the names of primitives of the low level design 104 to the block instances 106 may be difficult because of name changes and the low-level implementation details for the design blocks. For example, a block instance 106 named "2D_Lowpass" in Xilinx's System Generator HLMS may be altered by HDL synthesizer 112, mapper 114, place-and-route tool 116 into "\_2d_lowpass\_" in low-level design 104. Block "\_2d_lowpass\_" in low level design 104 may be implemented using two primitives "AND3" and "OR2" and a timing path may be specified in low level analysis data 120 as passing through block input "\_2d_lowpass\_/FILT_IN," primitive input "\_2d_lowpass\_/AND3/IN_B," primitive output "\_2d_lowpass\_/AND3/OUT," primitive input "\_2d_lowpass\_/OR2/IN_A," primitive output "\_2d_lowpass\_/OR2/OUT," and block output "\_2d_lowpass\_/FILT_OUT". It may be difficult for a user of HLMS 102 to discern that a timing path through these inputs and outputs of block "\_2d_lowpass\_" and primitives "\_2d_lowpass\_/AND3" and "\_2d_lowpass\_/OR2" is a timing path through a block instance 106 named "2D_Lowpass".

Various embodiments of the invention back-annotate low level analysis data 120 into HLMS 102. Back-annotation of low level analysis data 120 into HLMS 102 uses the matching of names from the low-level analysis data 120 into corresponding names in the HLMS 102.

Figure 2:
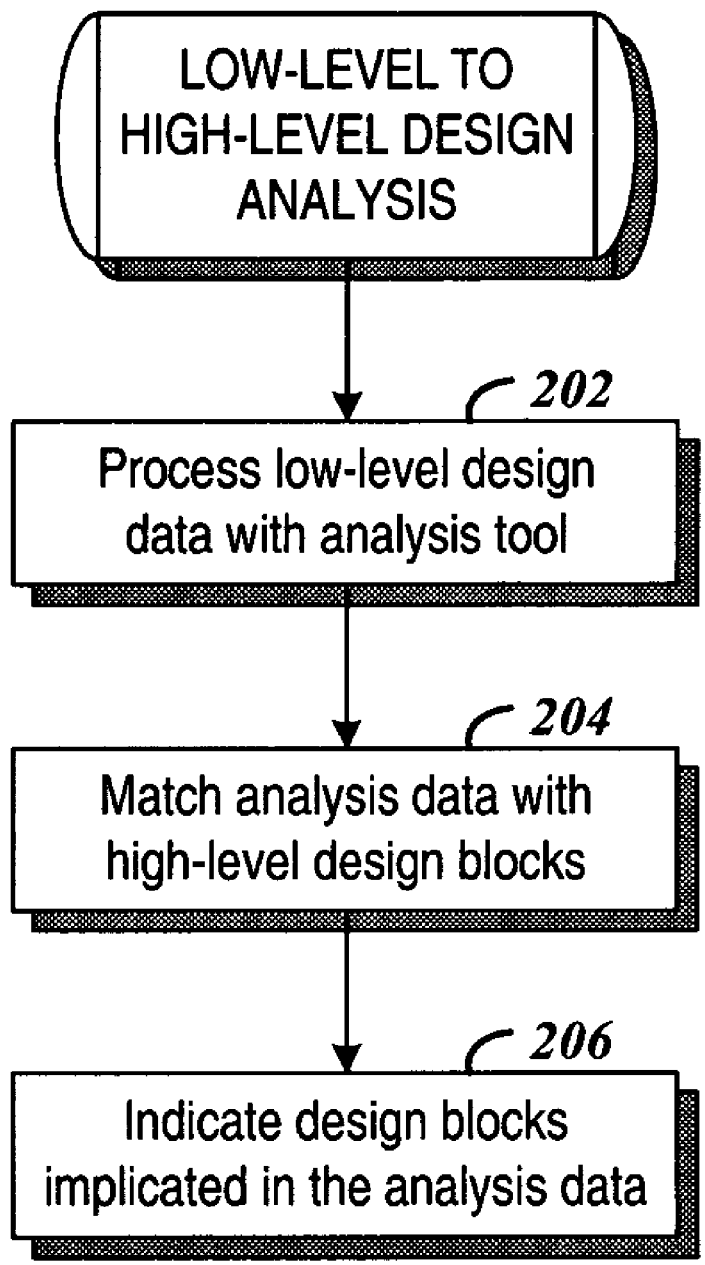
FIG. 2 is a flow diagram that shows an example process for analyzing a low-level design with matching to high level block instances in accordance with various embodiments of the invention.

FIG. 2 is a flow diagram that shows an example process for analyzing a low-level design with matching to high level block instances. At step 202, the low-level design data is processed using an analysis tool, and the low-level analysis data is stored for further analysis. At step 204, the low-level analysis data is matched with the high-level block instances in an HLMS.

The matching of step 204 may include multiple pattern matching steps. A pattern matching step may correlate a name from the low-level analysis data into a corresponding name of high-level block instances in the HLMS. The pattern matching compensates for the modification of names by the various tools that translate the electronic circuit design from a high-level design to a low-level design by finding a best pattern match between each name in the low-level analysis data and the names in the HLMS.

At step 206, the block instances implicated in the analysis data are indicated in the HLMS. In one embodiment, a listing of paths is presented to a user of an HLMS and the user may select one of the paths and the block instances and connections corresponding to the selected path are highlighted in a graphical user interface of the HLMS.

The listing of paths may be presented to the user in one or more of several views which may be selectable by the user. In one view, for example, the paths are presented using the low level names from the low-level analysis data. In another view, the paths are presented using the corresponding high-level names from the matching of step 204. In yet another view, each path is presented on a histogram as a box placed in a column for a range of lengths corresponding to the range including the length of the path. For each view the length of the path may additionally be indicated. It will be appreciated that the length of the path may be relatively quantified, such as presenting the length of a propagation delay for a path as the difference between the propagation delay for the path and a targeted clock period.

Figure 3:
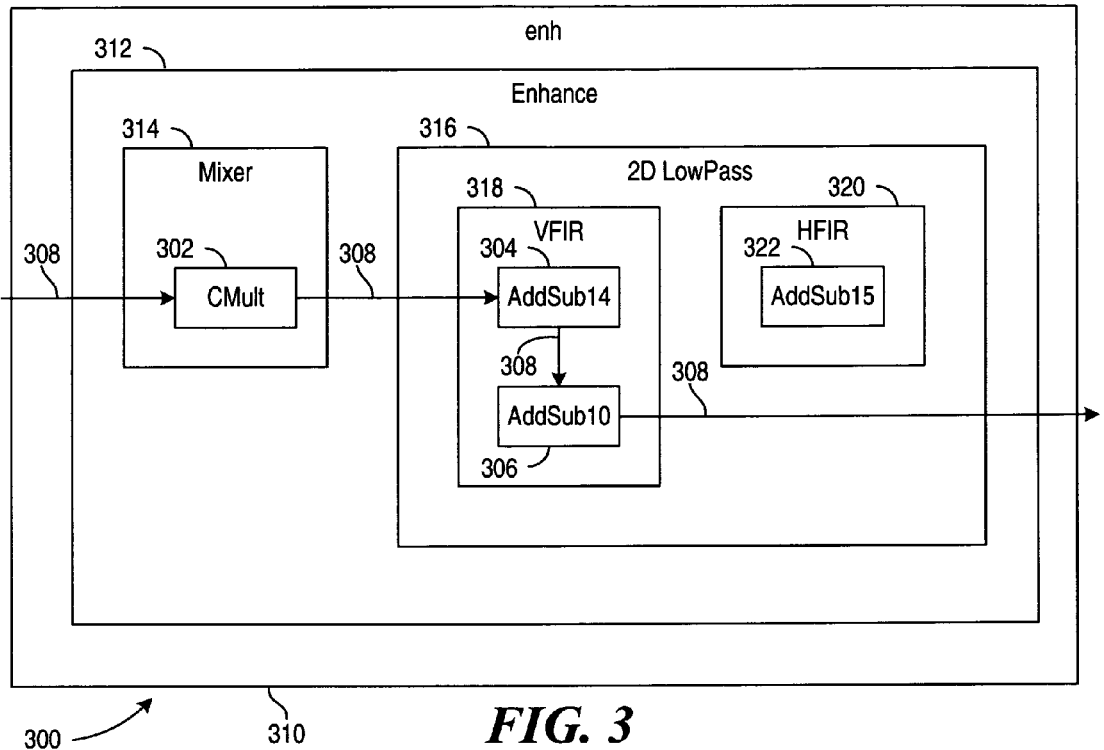
FIG. 3 is a block diagram of a hierarchy of block instances for an example electronic design in accordance with various embodiments of the invention.

FIG. 3 is a block diagram of a hierarchy of block instances for an example electronic design 300 in accordance with various embodiments of the invention. A user interface of the HLMS may display the hierarchy of block instances in a manner corresponding to FIG. 3. The user interface may also display or highlight the example timing path coupling block instances 302, 304, and 306, via lines 308. The example timing path may be highlighted in response to a user selecting the timing path from a listing of timing paths for the example electronic design 300. This timing path may be a back-annotation into the HLMS of a low-level timing path from a static timing analysis of a low-level design.

The electronic design 300 may have a root-level block instance 310 having an instance name of "enh," and containing a second-level block instance 312 having an instance name of "Enhance." Block instance 312 contains the block instance 314 having an instance name of "Mixer," which contains block instance 302 having an instance name of "CMult," and the block instance 316 having an instance name of "2D_Lowpass." Block instance 316 contains block instance 318 having instance name "VFIR," which contains block instances 304 and 306 having respective instance names "AddSub14" and "AddSub15," and block instance 320 having instance name "HFIR," which contains block instance 322 having instance name "AddSub15." It will be appreciated that block instances 304, 306, and 322 may be separate instances of the same block.

Figure 4:
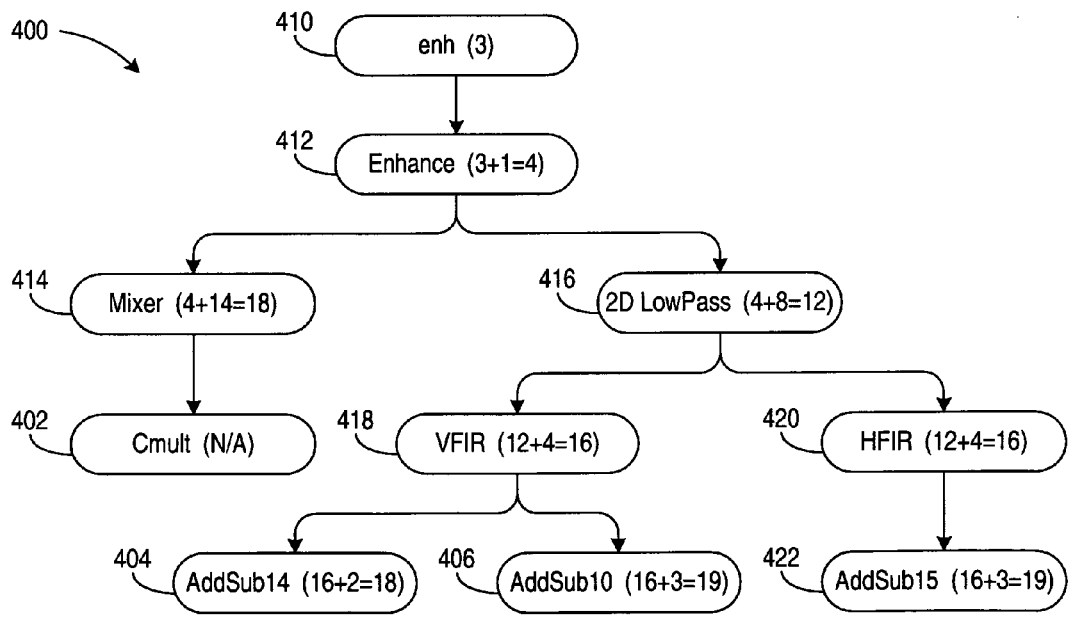
FIG. 4 is a diagram of a tree corresponding to the hierarchy of block instances of FIG. 3.

FIG. 4 is a diagram of a tree 400 corresponding to the hierarchy of block instances of FIG. 3. Each node 402 through 422 of the tree 400 is labeled with the instance name of the corresponding block instance in the HLMS from FIG. 3, and an edit distance calculation in parentheses. Nodes 410, 412, 414, 416, 402, 418, 420, 404, 406, and 422 may correspond to block instances 310, 312, 314, 316, 302, 318, 320, 304, 306, and 322 of FIG. 3.

Low-level analysis data, such as static timing analysis data for a low-level design for electronic design 300 of FIG. 3, may include an instance with a low-level hierarchical identifier of "top/enhance/_2d_lowpass_/vfir/addsub14/core_instance4/BU14" and various embodiments of the invention may match this low-level hierarchical identifier with node 404 and the corresponding block instance 304 of FIG. 3 in the HLMS that has a high-level hierarchical identifier that is "enh/Enhance/2D_LowpassN/FIR/AddSub14." Hence as can be seen from this example, FIG. 4 is a hierarchical tree for the high level hierarchical identifiers, while "top/enhance/2d_lowpass_/vfir/addsub14/core_instance4/BU14" is from a hierarchical tree of low level identifiers. Thus, for example, at the top of this low level identifier tree is "top", the next level down would have "enhance", a third level down would have "_2d_lowpass_" and so forth. Thus in one exemplary embodiment of the present invention maps the nodes in the first hierarchical tree for the high level hierarchical identifiers with their corresponding nodes in the second hierarchical tree for the low level hierarchical identifiers.

The instance names in corresponding low-level and high-level hierarchical identifiers may be different because various tools, such as a synthesizer, a mapper, and a place-and-route tool, may modify the instance names of high-level blocks to generate the low-level design. Further, these tools may modify the instance names of high-level blocks in an unspecified manner and/or in a manner that may vary between versions of these tools. In addition, the low-level design may include additional design details. Various embodiments of the invention may match a low-level hierarchical identifier for an electronic circuit design with a corresponding high-level hierarchical identifier while tolerating instance name changes and additional design details.

Pattern matching may be used to match the instance names of the low-level hierarchical identifier with the corresponding instance names of the high-level hierarchical identifiers. Example pattern matching approaches include edit distance, longest common substring, and regular expression methods.

Edit distance methods may count the number of character additions, deletions, and substitutions necessary to convert a character string, such as instance name "_2d_lowpass_" of the low-level hierarchical identifier, into a corresponding character string, such as "2D_Lowpass" of a high-level hierarchical identifier, or vice versa. Converting "_2d_lowpass_" into "2D_Lowpass" may require deleting four underscore characters and four character substitutions including respectively substituting a "d", an underscore, an "l", and a "p" with a "D", a space, an "L", and a "P", for a total edit distance of eight.

Example edit distance methods include the Levenshtein edit distance method and the Damerau edit distance method. In certain embodiments, a pattern matching approach may stipulate that a difference between a lower case and a similar upper-case character does not contribute to the edit distance. The Levenshtein edit distance method and/or the Damerau edit distance method are used in some embodiments of the invention. In other embodiments, other pattern matching routines having other similarity (or dissimilarity) measurements, including pattern matching routines having other edit distance measurements, as known to one of ordinary skill in the art, may be used. Some examples are described in the article "Pattern Matching" by Gonzalo Navarro of the Department of Computer Science University of Chile, which is herein incorporated by reference.

The matching of the low-level hierarchical identifier with one of the high-level hierarchical identifiers may proceed by traversing the tree 400 by levels. A first level, or root level, of the tree 400 is the node 410, and similarly a second level is the node 412. The third level of the tree 400 is the nodes 414 and 416, and the fourth level is the nodes 402, 418, and 420. The fifth and final level of the tree 400 is the nodes 404, 406, and 422. The level of a particular node may be determined from the number of nodes in the tree inclusively between the particular node and the root node.

Matching the low-level hierarchical identifier "top/enhance/_2d_lowpass_/vfir/addsub14/core_instance4/BU14" with one of the high-level hierarchical identifiers and corresponding block instance may begin at the root level of tree 400 by determining the edit distance between the root-level instance name "top" of the low-level hierarchical identifier and the root-level instance name "enh" of node 410. The edit distance is three because three character substitutions are required to convert between these names. The edit distance of three may be associated with node 410 as parenthetically shown. Because tree 400 has only one node 410 at the root level, the matching may proceed to the next level.

Even though every high-level hierarchical identifier may include a root-level instance name of "enh," the matching of a particular low-level hierarchical identifier with one of the high-level hierarchical identifiers may require only one edit distance calculation between the corresponding root-level instance names. Various embodiments of the invention efficiently match hierarchical identifiers because edit distances between instances names are calculated only once for each pairing of an instance name of a first hierarchical identifier and one of the instance names at a corresponding level of a set of second hierarchical identifiers.

For the second level of the tree 400, the edit distance is determined between second-level instance name "enhance" of the low-level hierarchical identifier and the instance name "Enhance" of second level node 412. The edit distance is one because one character substitution is needed. This edit distance is added to the edit distance of the parent node 410 to calculate a cumulative edit distance of four as parenthetically shown. Generally, a cumulative edit distance is associated with each node 404 through 422, excluding the root node 410, by adding the edit distance for the node to the cumulative edit distance of the parent node in the tree 400. The cumulative edit distance may be used at the final level of tree 400 to determine which high-level hierarchical identifier matches a given low-level hierarchical identifier.

The third level of tree 400 has two nodes 414 and 416 with respective edit distances of 14 and 8. In certain embodiments of the invention, the traversal of tree 400 is pruned using a standard deviation or other distribution factor calculated from the edit distances of a level. Other example distribution factors include variance about the mean of the edit distances and variance from the minimum of the edit distances. The standard deviation of the edit distances 14 and 8 may be 3. The standard deviation may be scaled by a factor that in one embodiment is 1.5 to yield a scaled distribution factor of 4.5. The scaled distribution factor may be added to the minimum of the edit distances of the nodes 414 and 416 for the third level to produce a threshold of 8+4.5=12.5 for the edit distance. The edit distance, 14, of node 414 exceeds this threshold and node 414 is pruned in the traversal of tree 400. Thus, the further traversal of tree 400 omits traversing the sub-tree of tree 400 that is rooted at node 414. The edit distance, 8, of node 416 is less than this threshold and the traversal of the next level of tree 400 includes the children of node 416. The pruning eliminates from further consideration the nodes that are unlikely to match the low-level hierarchical identifier. The scaling factor provides a degree of dissimilarity of instance names that is required for node pruning. Pruning may eliminate many nodes from further consideration, especially pruning that occurs at the levels near the root level. Thus, pruning may have a greater effect for the levels close to the root level than for levels further from the root. Because additional design details are usually added at the levels further from the root, the quick narrowing of the matching at the levels nearer the root may reduce the susceptibility of producing an improper match due to any additional design details.

The subset of tree 400 at the second level includes the nodes 414 and 416. The pruning of node 414 produces another subset that includes node 416 that has the children that are nodes 418 and 420. Nodes 418 and 420 become the subset of tree 400 that is included in the pattern matching for the fourth level. Because of the pruning, node 402 is not included in the pattern matching for the fourth level. Nodes 418 and 420 each have an edit distance of 4, and they have a distribution factor and a scaled distribution factor of zero and a threshold of 4. Because the edit distances of nodes 418 and 420 are equal to the threshold, these nodes are not pruned and their children, nodes 404, 406, and 422, become the nodes for the traversal of the fifth level of tree 400.

The fifth level of tree 400 is the final level, and pruning may optionally be bypassed for the final level. The cumulative edit distances of the nodes of the final level are calculated, and the node 404 with the minimum cumulative edit distance of 18 is selected to match the low-level hierarchical identifier. Node 404 corresponds to the block instance 304 of FIG. 4, and the corresponding high-level hierarchical identifier, "enh/Enhance/2D LowpassNFIR/AddSub14," can be determined from the nodes of tree 400 between node 404 and the root node 410. The sixth and seventh level instance names or sub-identifiers "core_instance4" and "BU14" of low-level hierarchical identifier "top/enhance/_2d_lowpass_/vfir/addsub14/core_instance4/BU14" may be ignored because the tree 400 has only five levels.

Figure 5:
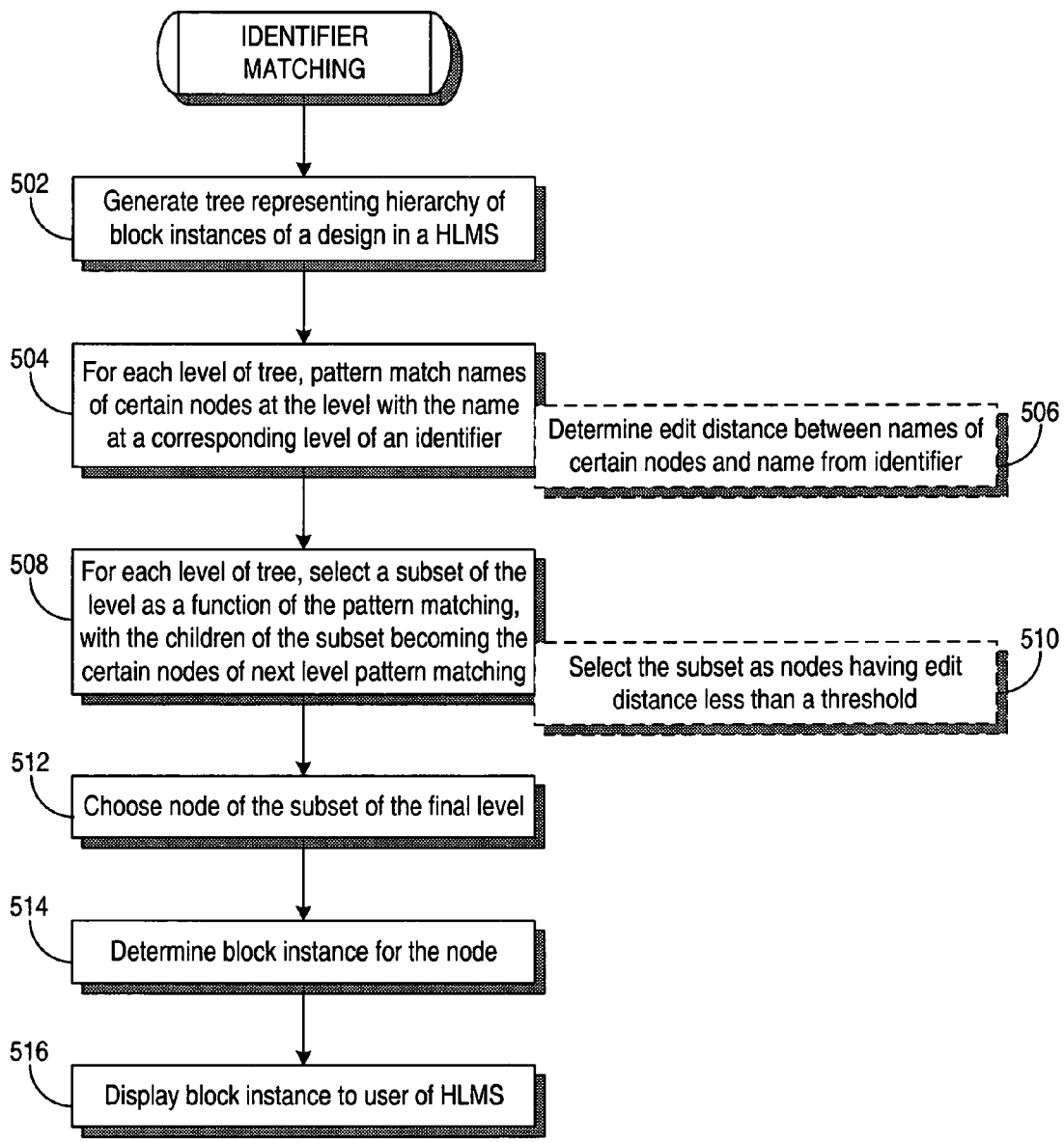
FIG. 5 is a flow diagram of a process for matching a hierarchical identifier with a block instance of a design in a high-level modeling system in accordance with various embodiments of the invention.

FIG. 5 is a flow diagram of a process for matching a hierarchical identifier with a block instance of a design in a high-level modeling system in accordance with various embodiments of the invention. The hierarchical identifier may be a low-level hierarchical identifier from a timing path of the design and the timing path in the HLMS may include the matching block instance.

At step 502, a tree is generated that represents the hierarchy of block instances of the design in the HLMS. Each node in the tree may include a name of the corresponding block instance. At step 504, the name at a level of the hierarchical identifier is pattern matched with the name of certain nodes at the level in the tree. The pattern matching is repeated for each level of the hierarchical identifier and/or each level of the tree. The certain nodes may be a subset of the nodes at the level of the tree, and these certain nodes may be determined from the pattern matching of the preceding levels of the tree. In one embodiment at step 506, the pattern matching for a level includes determining an edit distance between the name at the level of the hierarchical identifier and the name of each of the certain nodes at the level of the tree.

At step 508, a subset of the nodes at a level of the tree is selected as a function of the pattern matching. The selection of a subset of the node at a level of the tree is repeated for each level of the hierarchical identifier and/or each level of the tree. The children of the selected nodes of the subset for a level become the certain nodes for the next level of pattern matching at step 504. In one embodiment at step 510, the subset of the nodes at a level is selected as the nodes having an edit distance that is less than or equal to a threshold, while nodes having an edit distance greater than the threshold are pruned. A distribution factor, such as a standard deviation, of the edit distances of the certain nodes of the level may be determined, and the threshold may be the sum of a scaling of the distribution factor and the minimum of the edit distances of the certain nodes of the level. When the certain nodes at the level are only a single node, the single node may be selected without attempting any pruning.

At step 512, a matching node is chosen from the subset of step 508 for the final level of the tree. The corresponding block instance for this matching node is determined at step 514, and a symbol representative of the block instance is displayed to a user on a user interface of the HLMS at step 516. Displaying the block instance may include high-lighting the block instance and any other block instances for a timing path of the design. Users of an HLMS produce and understand an electronic system design in a graphical context. Timing reports of low-level analysis data are typically presented as text listing low-level paths. The correlation of the textual timing paths to a graphical presentation in a graphical user interface of a HLMS allows a user of the HLMS to examine the timing paths in an environment matching the graphical context used to produce and understand the electronic system design.

Figure 6:
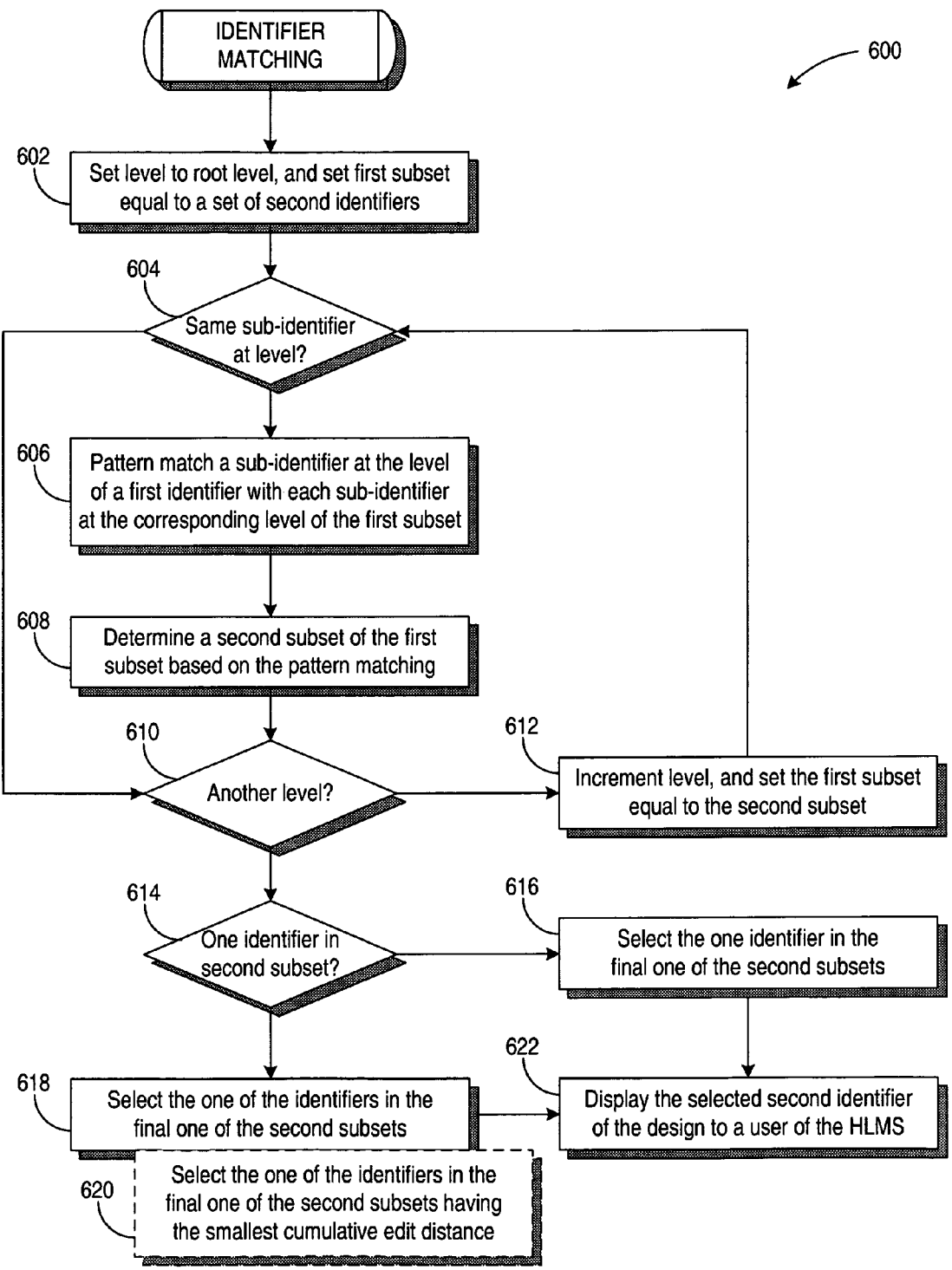
FIG. 6 is a flow diagram of a process for matching a hierarchical identifier with one hierarchical identifier from a set of hierarchical identifiers in accordance with various embodiments of the invention.

FIG. 6 is a flow diagram of a process 600 for matching a hierarchical identifier with one hierarchical identifier from a set of hierarchical identifiers in accordance with various embodiments of the invention. An example set of hierarchical identifiers is the hierarchical identifiers for the block instances in the hierarchy of a design in a HLMS. The hierarchical identifiers have a sub-identifier for each level of each hierarchical identifier. For example, the name of a block instance may be a sub-identifier in a hierarchical identifier for the block instance. A set of hierarchical identifiers generally has a corresponding tree with a node for each sub-identifier of the hierarchical identifiers, and the various subsets of the set of hierarchical identifiers for process 600 similarly have a corresponding sub-tree.

Process 600 matches a first hierarchical identifier with one hierarchical identifier from a set of second hierarchical identifiers. At step 602, a current level is set to the root level and a first subset of the second hierarchical identifiers is initialized to equal to the set of second hierarchical identifiers. Decision 604 checks whether the first subset has the same sub-identifier at the current level for every second hierarchical identifier in the first subset, corresponding to the sub-tree for the first subset having a single node at the current level. For the same sub-identifier at the current level of every second hierarchical identifier in the first subset, process 600 bypasses steps 606 and 608 and proceeds to step 610; otherwise, process 600 proceeds to step 606.

At step 606, the sub-identifier at the current level of the first hierarchical identifier is pattern matched with each sub-identifier at the corresponding level of the first subset. At step 608, a second subset of the first subset is determined based on the pattern matching to potentially prune second hierarchical identifiers that are unlikely matches due to relatively significant differences in the sub-identifiers at the level. For a final level, the second subset may optionally be set to the first subset without any pruning. It will be appreciated that certain tools, such as a synthesizer, a mapper, and a place-and-route tool, may add an extra layer of hierarchy having a special identifying instance name and any layer of hierarchy with such a special identifying instance name may be ignored.

Decision 610 checks whether there are more levels for pattern matching. For addition levels, the current level is incremented and the first subset is set to the second subset at step 612 and process 600 iterates back to decision 604. When all levels have been considered, process 600 proceeds to decision 614. When the pruning of the first subset results in a second subset having a single second hierarchical identifier, process 600 proceeds from decision 614 to step 616, and otherwise process 600 proceeds to step 618. At step 616, the single second hierarchical identifier is selected, and at step 618 one of the second hierarchical identifiers in the second subset is selected based on the pattern matching. In one embodiment at step 620, the second hierarchical identifier in the second subset having a shortest cumulative edit distance is selected. The selected second identifier is displayed on a user interface of the HLMS at step 622.

In an alternative embodiment, the first subset is not modified at step 612 and the first subset remains the set of second hierarchical identifiers throughout process 600. At step 618, one of the second hierarchical identifiers is selected from the intersection of all the respective second subsets for the levels that are determined at step 608. It will be appreciated that setting the first subset equal to the second subset as is shown for step 612 results in a second subset for the final level that is the intersection of all the second subsets of this alternative embodiment.

Those skilled in the art will appreciate that various alternative computing arrangements, including one or more processors and a memory arrangement configured with program code, would be suitable for hosting the processes and data structures of the different embodiments of the present invention. In addition, the processes may be provided via a variety of computer-readable media or delivery channels such as magnetic or optical disks or tapes, electronic storage devices, or as application services over a network.

The present invention is thought to be applicable to a variety of systems for analyzing electronic circuit designs. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A processor-based method for matching a hierarchical identifier with a block instance of a design in a high-level modeling system, comprising:

generating a tree representing a hierarchy of a plurality of block instances of the design in the high-level modeling system, wherein the tree includes a respective node for each block instance of the design, and the respective node includes a first name of the block instance;

for each successive level of the hierarchy of the tree beginning at a root-level, pattern matching the first name of each node in a first subset of the level of the hierarchy with a second name at a corresponding level of the hierarchical identifier;

for each successive level of the hierarchy of the tree beginning at the root-level, selecting a second subset of the first subset of the level of the hierarchy as a function of the pattern matching for the level, wherein, for each successive level of the hierarchy of the tree other than a final-level, a set of children of the second subset of the level of the hierarchy comprises another first subset of a successive level of the hierarchy;

choosing a node of another second subset of the final-level of the hierarchy; and determining a block instance of the node.

2. The method of claim 1, wherein the pattern matching for the level includes determining a respective edit distance between the first name of each node in the first subset and the second name at the corresponding level of the hierarchical identifier, and the selecting for the level includes having the second subset include each node in the first subset that has the respective edit distance that is less than a threshold that is a sum of a minimum of the respective edit distance of each node in the first subset and a scaling of a distribution factor of the respective edit distance of each node in the first subset.

3. A method using a computer for matching a first hierarchical identifier from a set of first hierarchical identifiers with a second hierarchical identifier from a set of second hierarchical identifiers, comprising:

for each of a plurality of levels, pattern matching a first sub-identifier at the level of the first hierarchical identifier with each second sub-identifier at a corresponding level of at least one second hierarchical identifier in a respective first subset of the second hierarchical identifiers of a design in a high-level modeling system;

for each of the plurality of levels, determining a respective second subset of the respective first subset in response to the pattern matching; and selecting the one hierarchical identifier from an intersection of all of the second subsets.

4. The method of claim 3, further comprising modifying one of the second hierarchical identifiers into the first hierarchical identifier by at least one tool used to translate the design in the high-level modeling system into a low-level implementation of the design and displaying the one hierarchical identifier of the design on a user interface of the high-level modeling system.

5. The method of claim 4, wherein the first hierarchical identifier is part of a timing path of the low-level implementation of the design.

6. The method of claim 5, wherein the displaying the one hierarchical identifier includes displaying a high-level path, which includes the one of the second hierarchical identifiers and corresponds to the timing path, on the user interface of the high-level modeling system.

7. The method of claim 3, wherein the respective first subset of the pattern matching for a root level of the levels is the set of the second hierarchical identifiers, and for each one of the levels in an successive order following the root level, the respective first subset of the pattern matching for the one of the levels is the respective second subset of the determining for a preceding one of the levels in the successive order.

8. The method of claim 7, wherein the selecting selects the one hierarchical identifier from the respective second subset of the determining for a final one of the levels in the successive order.

9. The method of claim 8, wherein in response to the respective second subset for the final one of the levels including exactly one second hierarchical identifier, the selecting selects the one second hierarchical identifier.

10. The method of claim 8, wherein in response to the respective second subset for the final one of the levels including at least two second hierarchical identifiers, the selecting includes selecting the one hierarchical identifier from the at least two second hierarchical identifiers in response to the pattern matching.

11. The method of claim 10, wherein the pattern matching includes determining a respective edit distance between the first sub-identifier at the level of the first hierarchical identifier and each second sub-identifier at the corresponding level of the at least one second hierarchical identifier, and the selecting includes selecting the one hierarchical identifier of the at least two hierarchical identifiers that has a cumulative edit distance that is shortest.

12. The method of claim 11, wherein the respective edit distance is determined using one of a Levenshtein method, a Damerau method, a longest-common-substring method, and a regular expression method.

13. The method of claim 3, further comprising bypassing the pattern matching and the determining for the level in response to a same second sub-identifier at the corresponding level of every second hierarchical identifier in the respective first subset.

14. The method of claim 3, wherein the pattern matching includes determining a respective edit distance between the first sub-identifier at the level of the first hierarchical identifier and each second sub-identifier at the corresponding level of the at least one second hierarchical identifier.

15. The method of claim 14, wherein the respective edit distance is determined using one of a Levenshtein method, a Damerau method, a longest-common-substring method, and a regular expression method.

16. The method of claim 14, wherein in response to a same second sub-identifier at the corresponding level of all of the at least one second hierarchical identifier, the determining includes the respective second subset being the respective first subset.

17. The method of claim 14, wherein in response to a plurality of second sub-identifiers at the corresponding level of all of the at least one second hierarchical identifier, the determining the respective second subset of the respective first subset includes determining a distribution factor for the edit distances of the second sub-identifiers.

18. The method of claim 17, wherein the distribution factor is one of a standard deviation of the edit distances, variance about the mean of the edit distances, and variance from the minimum of the edit distances.

19. The method of claim 17, wherein the determining has the respective second subset include each second hierarchical identifier of the respective first subset that has the respective edit distance for the second sub-identifier that is less than a threshold that is a sum of a scaling of the distribution factor and a minimum of the respective edit distance of each node in the first subset.

20. An article of manufacture, comprising:

a computer readable medium for matching a hierarchical identifier with a block instance of a design in a high-level modeling system, the medium comprising:

code for generating a block instance tree representing a hierarchy of a plurality of block instances of the design in the high-level modeling system, wherein the block instance tree includes a respective node for each block instance of the design, and the respective node includes a first name of the block instance;

for each successive level of the hierarchy of the block instance tree beginning at a root-level, code for pattern matching the first name of each node in a first subset of the level of the hierarchy of the block instance tree with a second name at a corresponding level of a hierarchical identifier tree;

for each successive level of the hierarchy of the block instance tree beginning at the root-level, code for selecting a second subset of the first subset of the level of the hierarchy of the block instance tree as a function of the pattern matching for the level of the block instance tree, wherein, for each successive level of the hierarchy of the block instance tree other than a final-level, a set of children of the second subset of the level of the hierarchy of the block instance tree comprises another first subset of a successive level of the hierarchy of the block instance tree;

code for choosing a node of another second subset of the final-level of the hierarchy of the block instance tree; and code for determining a block instance of the node.

* * * * *